(12) United States Patent
Taguchi

(10) Patent No.: US 7,310,778 B2
(45) Date of Patent: Dec. 18, 2007

(54) GRAPHICAL ELEMENT SELECTION PROGRAM

(75) Inventor: Terutoshi Taguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 686 days.

(21) Appl. No.: 10/776,259

(22) Filed: Feb. 12, 2004

(65) Prior Publication Data

US 2004/0189632 A1    Sep. 30, 2004

(30) Foreign Application Priority Data

Mar. 27, 2003    (JP) .............................. 2003-087996

(51) Int. Cl.
*G06F 3/048* (2006.01)

(52) U.S. Cl. ..................................... 715/763

(58) Field of Classification Search ................ 715/763; 345/420
See application file for complete search history.

(56) References Cited

U.S. PATENT DOCUMENTS

| | | | | |
|---|---|---|---|---|
| 4,944,034 A | * | 7/1990 | Ohsawa ....................... | 345/419 |
| 5,440,674 A | * | 8/1995 | Park ............................ | 345/423 |
| 6,552,722 B1 | * | 4/2003 | Shih et al. ................... | 345/419 |
| 6,965,690 B2 | * | 11/2005 | Matsumoto ................. | 382/154 |
| 7,095,408 B1 | * | 8/2006 | Lu et al. ..................... | 345/419 |
| 7,098,909 B2 | * | 8/2006 | Hayano et al. ............. | 345/420 |

FOREIGN PATENT DOCUMENTS

JP    2001-092992    4/2001

* cited by examiner

*Primary Examiner*—Kristine Kincaid
*Assistant Examiner*—Le Nguyen
(74) *Attorney, Agent, or Firm*—Staas & Halsey LLP

(57) ABSTRACT

A graphical element selection program facilitates the selection of a concave portion of a model, by introducing a water source model with which an image of water flowing down from a water source can be conjured and selecting the concave portion in which the water is accumulated from the model.

8 Claims, 6 Drawing Sheets

(A)

(B)

GRAPHICAL ELEMENT SELECTION PROGRAM

FIELD OF THE INVENTION

The present invention relates to a technique for facilitating the selection of a concave portion in a model in three-dimensional CAD.

RELATED ART OF THE INVENTION

In three-dimensional CAD, with regard to each element constituting a model, such as surfaces, edge lines and the like, it is necessary to perform batch processing such as attribute addition, deletion, move and so on for not only a single element but also a plurality of elements in various cases. For a selecting method of a plurality of element, such a selecting method is typical in which an operation of selecting the elements one at a time using an input device such as a keyboard and a mouse is repeated a plurality of times, to select all elements to be processed. However, when there are too many elements to be processed, to select the plurality of elements in such a manner results in problems of a large amount of labor and poor operational performance. Therefore, in order to facilitate the selection of a convex portion of a model, as disclosed in Japanese Unexamined Patent Publication 2001-92992, there has been proposed a technique to select a surface exposed by light from a light source by determining whether an inner product of a normal vector and a sight line vector is positive or negative.

However, in such a conventional technique, although the convex portion of the model can be selected easily, a concave portion cannot be selected. Therefore, in order to select the concave portion of the model, an operation of selecting its elements one at a time must be repeated, which still remains in poor operability. Further, the easy and quick selection of a plurality of elements affects significantly on the improvement of creating efficiency in modeling, in other words, "the reduction of the time required for designing" on which the greatest importance is placed in designing work, and therefore, an effective method of selecting a plurality of elements has been eagerly expected.

Thus, in view of the above conventional problem, it is an object of the present invention to provide a graphical element selection program that facilitates the selection of a concave portion of a model by introducing a water source model with which an image of water flowing down from a water source can be conjured and selecting the concave portion in which the water is accumulated from the model.

SUMMARY OF THE INVENTION

To this end, in a graphical element selection program according to the present invention, using a water source model with which an image of water flowing down from a water source can be conjured, a vector downward from the water source in a vertical direction is defined, one surface intersecting the vector among all surfaces constituting a model is specified, and at least one surface constituting a concave portion including the intersecting surface is selected. At this time, the water source model may consist of a model of arbitrary shape to which added is an attribute for distinguishing the water source model from the model being an object of graphical element selection. Further, it is desirable that the water source model has a shape of water tap to facilitate an operator to conjure the image. Then, when at least one surface constituting the concave portion including the intersecting surface is selected, differential models are created by a difference set operation to subtract the model from the smallest cube enclosing the model, a particular differential model that is matched geometrically and positionally with the intersecting surface is specified from the differential models, and surfaces that are matched geometrically and positionally with the specified differential model are selected as the concave portion by comparing all surfaces of the model with the specified differential model.

According to the configuration described above, as the water source model is moved to a position above the model, from a portion in which water flowing down from the water source model in the vertical direction is accumulated, the surfaces in contact with the water are selected as the concave portion. As a result, although a new concept has been introduced, graphical elements can be selected easily and intuitively even though the model has a complex shape. At this time, since the moving operation of the water source is the same as that of the model, the operation can be learned very easily, and therefore, the time required for modeling can be reduced. Accordingly, due to the reduction of the modeling time, it becomes possible to realize the reduction of the time required for designing, on which the greatest importance is placed in designing work. Moreover, when the water source model has any shape, in particular the shape of water tap, the image of the water flowing down from the water source model can be conjured easily and, therefore, the water source model can be manipulated intuitively.

Here, when at least one surface constituting the concave portion including the intersecting surface is selected, it is desirable that a display color thereof is changed. Thus, information for judging whether the desired graphical element is selected or not can be provided to the operator of a three-dimensional CAD.

Further, the process for selecting the concave portion from the model may be performed depending on the capacity of a computer, in real time with the movement of the water source model, when the water source model is stopped after its movement, or when a finalization operation is performed on the intersecting surface that is shown explicitly while the water source model is being moved.

Other objects and aspects of the present invention will be apparent from the following description of embodiments in conjunction with accompanying drawings.

PREFERRED EMBODIMENTS

Hereinafter, the present invention will be described in detail with reference to the accompanying drawings.

Figure 1:
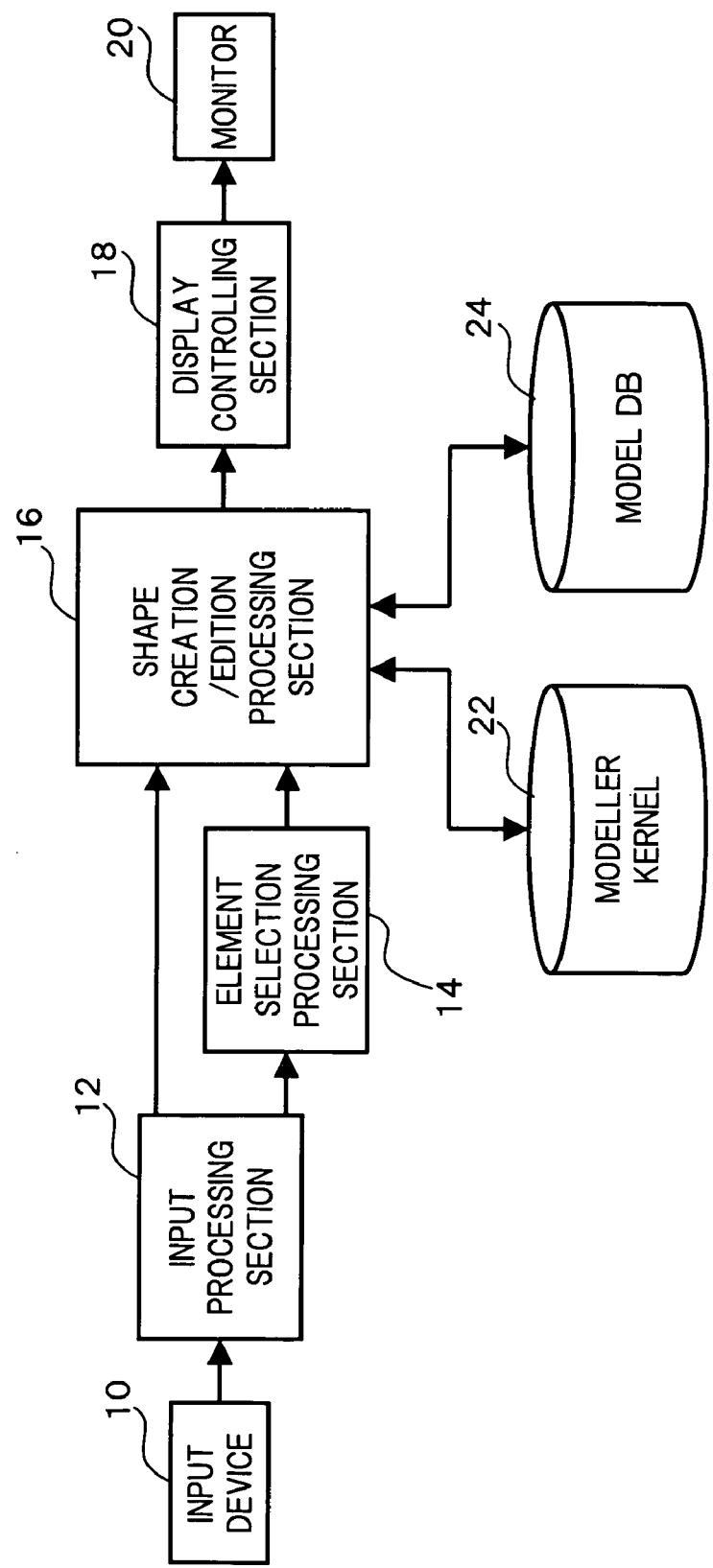
FIG. 1 is an overall block diagram of a three-dimensional CAD system to which the present invention is applied.

FIG. 1 shows an overall configuration of a three-dimensional CAD system constructed by installing a graphical element selection program according to the present invention in a computer incorporating at least a memory and a central processing unit.

The three-dimensional CAD system comprises an input device 10, an input processing section 12, an element selection processing section 14, a shape creation/edition processing section 16, a display controlling section 18, a monitor 20, a modeller kernel 22, and a model DB (database) 24. Here, the element selection processing section 14, the shape creation/edition processing section 16 and the display controlling section 18 are realized by respective programs loaded into the memory.

The input processing section 12 provides a function for converting signals from the input device 10 such as a keyboard and a mouse into a data format that can be processed by the element selection processing section 14 and the shape creation/edition processing section 16. The element selection processing section 14 provides a function for selecting a concave portion of a model by an operation described below, in addition to a function for selecting graphical elements in a conventional three-dimensional CAD system. The shape creation/edition processing section 16 provides a function for executing various operations in response to commands from the input device 10 (creation, attribute addition, deletion, move and so on) on the graphical elements selected by the element selection processing section 14. Here, the various operations in response to the commands are implemented by referring to the modeller kernel 22. The display controlling section 18 provides a function for scaling or overall displaying images representing the model on the monitor 20 such as a CRT (Cathode Ray Tube) or an LCD (Liquid Crystal Display). Created/edited models are registered in the model DB 24 as needed.

Here, with reference to FIG. 2, a theory of selection of the concave portion from the model will be described. In the present invention, a concept of a "water source model" is introduced. In the water source model, just like water flowing down from a water tap in a vertical direction, for example, a vector downward in the vertical direction is defined. At this time, in order to make the water source model to be manipulated intuitively, it is desirable to prepare, for example, a model having a shape of water tap, and add to this model an attribute for distinguishing it from the model being a graphical element selection object. Note, the water source model is not limited to the water tap shape and the water source model may be realized by adding the attribute to a model having any shape. Thus, by introducing the concept of the water source model, rather than using a vector simply, the selecting process of the graphical elements can be performed more intuitively and the operability can be improved.

Figure 2:
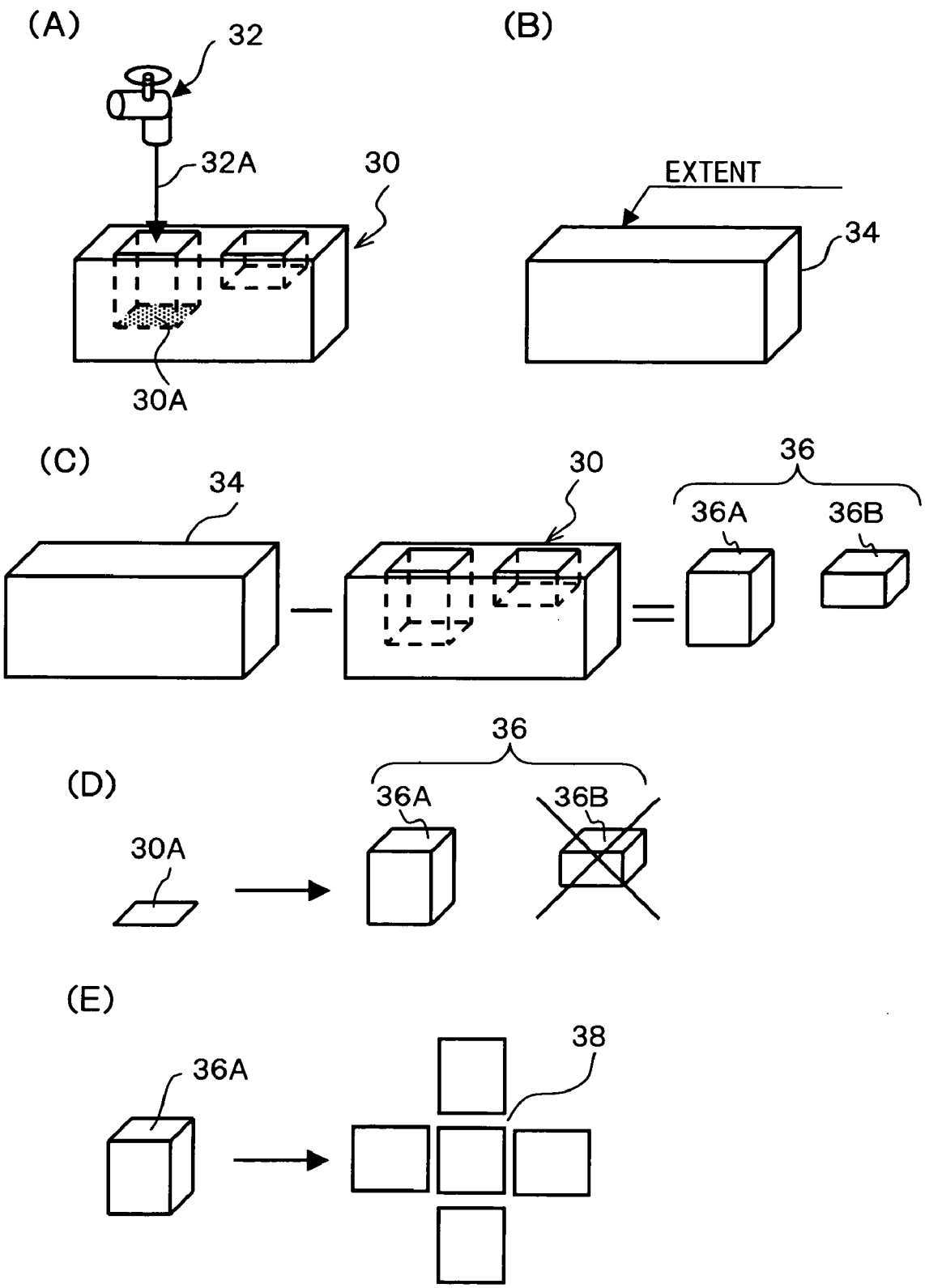
FIG. 2 shows a theory of selection of a concave portion from a model, wherein (A)-(E) are explanatory diagrams of respective steps of the selection process.
Figure 3:
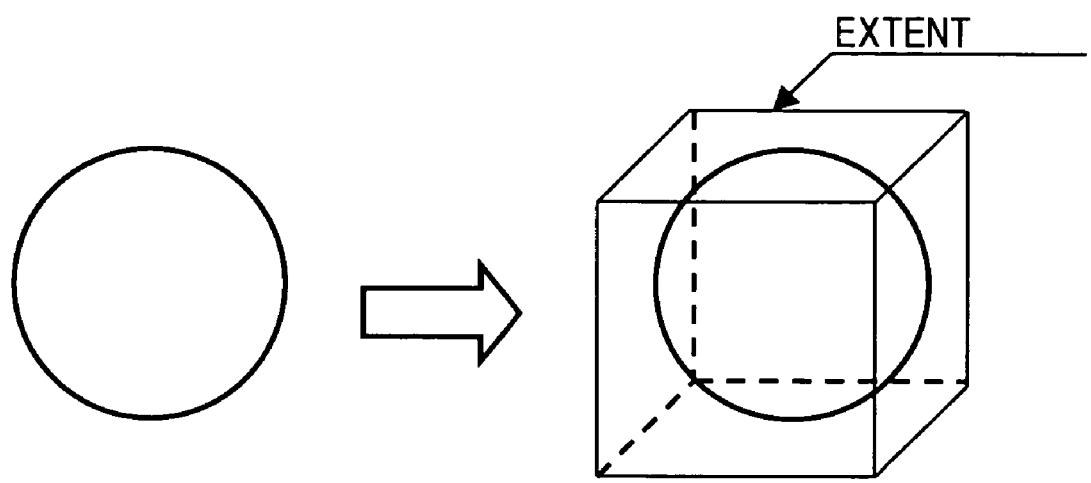
FIG. 3 shows an example of an extent, wherein (A) is an explanatory diagram of a sphere model and (B) shows an explanatory diagram of a model having a convex portion.
Figure 3:
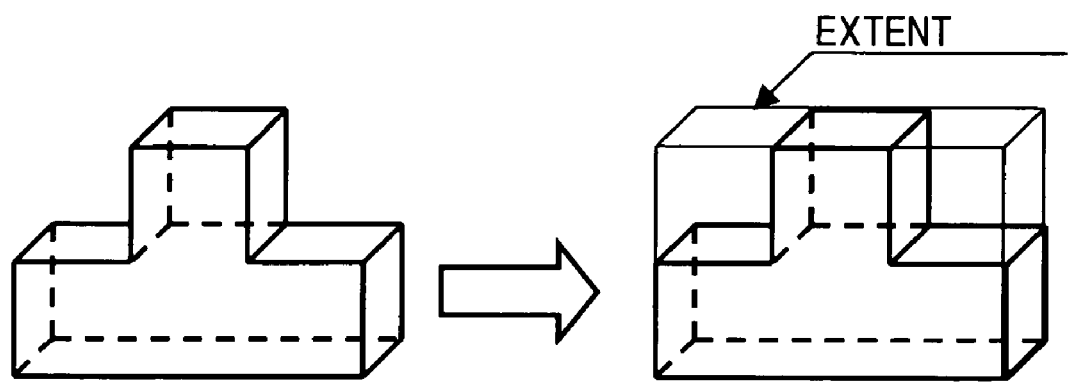

First, as shown in (A) of FIG. 2, the input device 10 is operated so as to move the water source model 32 to a position above the concave portion of a model 30 being the selection object. Then, among components constituting the model 30, a surface 30A intersecting a vector 32A downward from the water source model 32 in the vertical direction (a shadowed surface in the figure, hereinafter referred to as the "intersecting surface") is retrieved, and intersecting surface information for specifying this surface such as its ID is stored. Further, as shown in (B) of FIG. 2, the smallest cube (an extent) enclosing the model 30 is determined. By utilizing functions typically provided in the modeller kernel such as Parasolid in charge of modelling in the three-dimensional CAD system, the extent 34 can be determined easily not only for the shape of the model shown in (B) of FIG. 2 but also for various shapes as shown in FIG. 3.

Then, as shown in (C) of FIG. 2, a difference set operation to subtract the model 30 from the extent 34 is performed to create differential models 36 (36A and 36B in the shown example) representing a difference between the model 30 and the extent 34. Here, since the differential models 36 are determined by subtracting the model 30 from the minimum extent 34 enclosing the model 30, they represent the shape of water accumulated in the concave portions of the model 30. Next, as shown in (D) of FIG. 2, among the differential models 36, the one including a surface that is matched geometrically and positionally with the intersecting surface 30A is retrieved, to refine which differential model 36 includes the intersecting surface 30A. After the refinement of the differential models 36 has been performed, matching of all surfaces constituting the differential models 36 and the model 30 is performed, and all surfaces that are matched geometrically and positionally with the concave portion are selected as surfaces 38 constituting the concave portion, as shown in (E) of FIG. 2.

Figure 4:
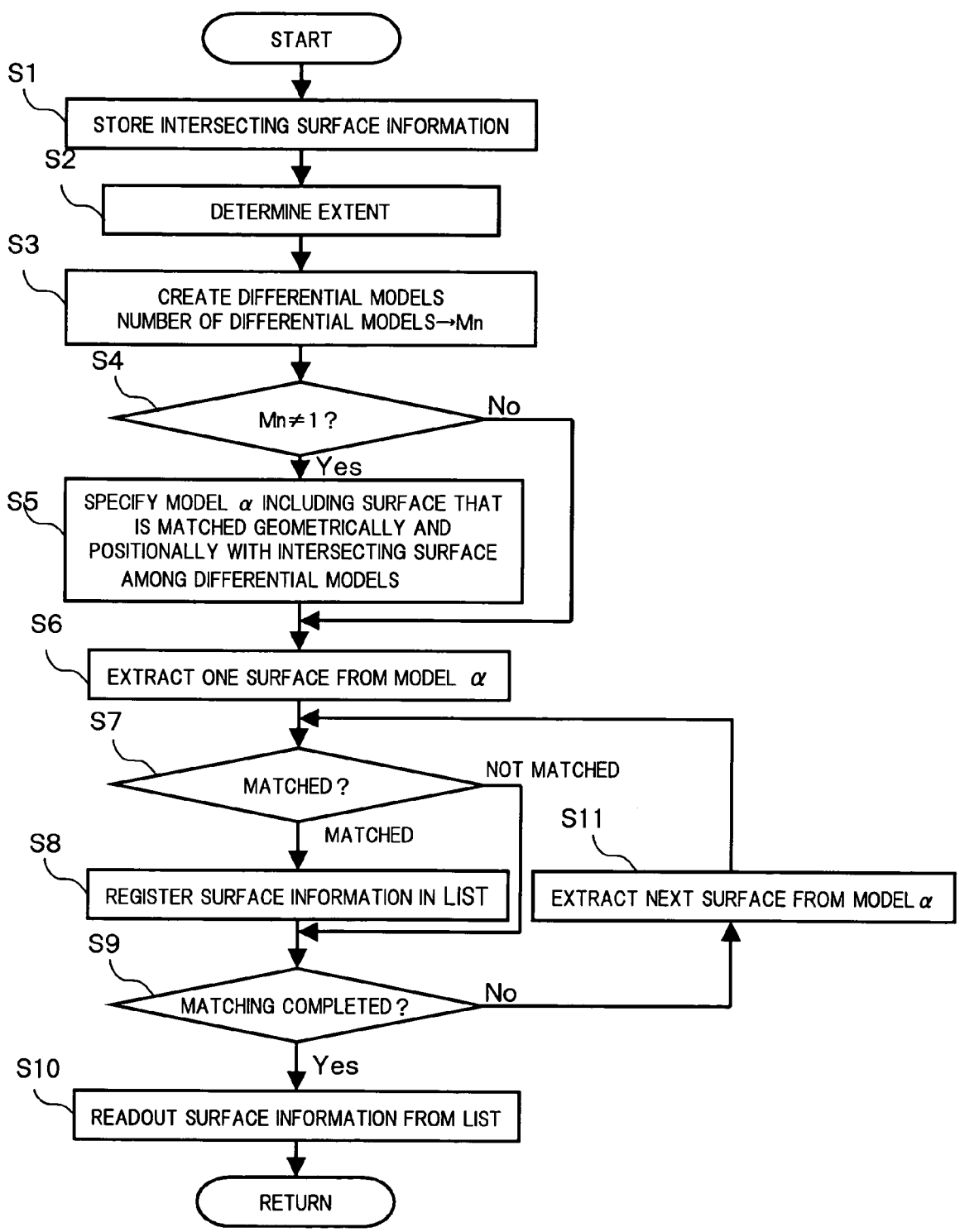
FIG. 4 is a flow chart showing a concave portion selection process.

FIG. 4 shows a flow chart of the process for selecting the concave portion from the model 30 by applying such a theory described above.

In step 1 (abbreviated as "S1" in the figures and the same rule will be applied hereunder), the intersecting surface 30A intersecting a vector 32A downward from the water source model 32 in the vertical direction is retrieved and intersecting surface information for specifying the intersecting surface 30A is stored.

In step 2, the extent 34 of the model 30 is determined.

In step 3, the differential models 36 representing the difference between the extent 34 and the model 30 are created by the difference set operation to subtract the model 30 from the extent 34. Further, the number of the created differential models 36 is set to a variable Mn.

In step 4, it is judged whether the variable Mn is 1 or not. Then, if the variable Mn is not 1(Yes), the process proceeds to step 5, where the stored intersecting surface information is referred to specify a model α including the surface that is matched geometrically and positionally with the intersecting surface 30A among a plurality of the differential models 36. Namely, the model α one of the surfaces of which is the intersecting surface 30A is specified. On the other hand, if the variable Mn is 1(No), the process proceeds to step 6.

In step 6, one surface is extracted from the model α.

In step 7, all surfaces of the model 30 are matched sequentially with the surface extracted in step 6 (hereinafter referred to as the "extracted surface") to retrieve a surface that is matched geometrically and positionally with the extracted surface. Then, if the surface matched with the extracted surface can be retrieved (Matched), the process proceeds to step 8, where surface information such as ID for specifying the surface is registered in a list. On the other hand, if the surface matched with the extracted surface cannot be retrieved (Not matched), the process proceeds to step 9.

In step 9, it is judged whether the matching of all surfaces of the model α with the model 30 has been performed or not. Then, if the matching has been completed (Yes), the process proceeds to step 10. On the other hand, if the matching has not been completed yet (No), the process proceeds to step 11, where a next surface (extracted surface) that has not yet been subjected to the matching is extracted from the model α.

In step 10, the surface information registered in the list is readout. Namely, since the list is stored with the surfaces matched geometrically and positionally with the surfaces constituting the model α, the surfaces registered in the list can be considered to constitute the concave portion of the model 30.

According to the process described above, from the portion in which water flowing down from the water source model 32 in the vertical direction is accumulated, the surfaces in contact with the water are selected as the concave portion. As a result, although a new concept has been introduced, graphical elements can be selected easily and intuitively even though the model 30 has a complex shape. At this time, since the movement operation of the water source model 32 is the same as that of the model 30, the operation can be learned very easily and, therefore, the time required for modeling can be reduced. Further, due to the reduction of the modeling time, it becomes possible to realize the reduction of the time required for designing, on which the greatest importance is placed in designing work.

Depending on the capacity of the computer, the concave portion selection process is performed in real time with the movement of the water source model 32, when the water source model 32 is stopped after its movement, or when a finalization operation is performed on the intersecting surface 30A that is shown explicitly while the water source model 32 is being moved. Hereinafter, execution timing in these cases will be described.

Figure 5:
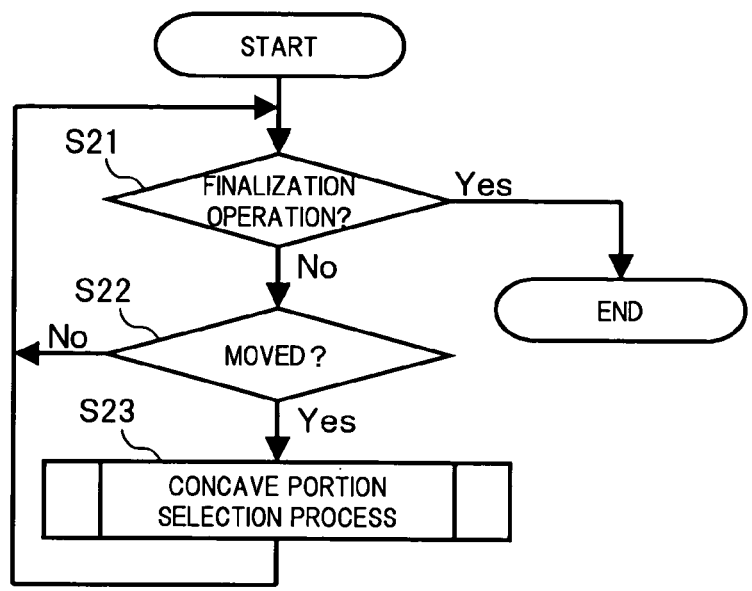
FIG. 5 is a flow chart showing a first embodiment of execution timing of the concave portion selection process.

FIG. 5 shows a process for executing the concave portion selection process in real time with the movement of the water source model 32.

In step 21, it is judged whether the finalization operation is performed or not. The finalization operation includes the input of a command, release of a button of mouse dragging the water source model or the like. Then, if the finalization operation is performed (Yes), the process is terminated and the surfaces selected in the concave portion selection process are considered as the concave portion. On the other hand, if no finalization operation is performed (No), the process proceeds to step 22.

In step 22, it is judged based on an event message of the input device 10 and the like whether the water source model 32 has been moved or not. Then, if the water source model 32 has been moved (Yes), the process proceeds to step 23, where the concave portion selection process shown in FIG. 4 is executed. On the other hand, if the water source model 32 has not been moved (No), the process returns to step 21.

According to the process described above, with the movement of the water source model 32, the surfaces constituting the concave portion of the model 30 located below the water source model 32 are selected in real time. Then, if the finalization operation is performed at that position, various operations in the three-dimensional CAD system can be performed immediately using the selected surfaces as the concave portion.

Figure 6:
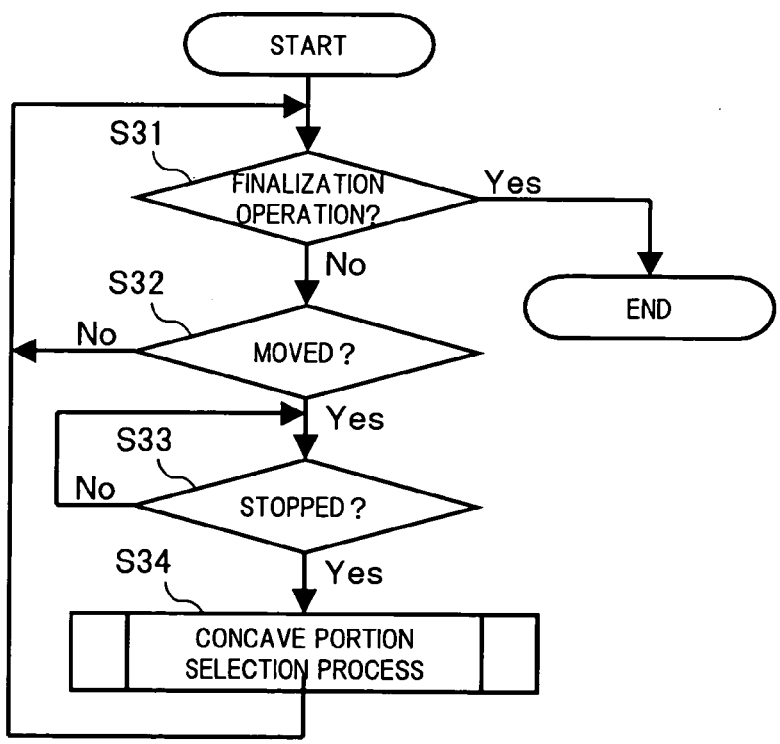
FIG. 6 is a flow chart showing a second embodiment of the execution timing of the concave portion selection process.

FIG. 6 shows a process for executing the concave portion selection process when the water source model 32 is stopped after its movement.

In step 31, it is judged whether the finalization operation is performed or not. Then, if the finalization operation is performed (Yes), the process is terminated and the surfaces selected in the concave portion selection process are considered as the concave portion. On the other hand, if no finalization operation is performed (No), the process proceeds to step 32.

In step 32, it is judged whether the water source model 32 has been moved or not. Then, if the water source model 32 has been moved (Yes), the process proceeds to step 33, while if the water source model 32 has not been moved (No), the process returns to step 31.

In step 33, it is judged based on the event message of the input device 10 and the like whether the water source model 32 is stopped or not. Then, if the water source model 32 is stopped (Yes), the process proceeds to step 34, where the concave portion selection process shown in FIG. 4 is performed. On the other hand, if the water source model 32 is not stopped (No), since it can be considered that the water source model 32 is still being moved, the process waits till the water source model 32 is stopped after its movement.

According to the process described above, since the concave portion selection process is executed only when the water source model 32 is stopped after its movement, the present program can be implemented without problems even in a computer having a relatively low computational load and a relatively poor capacity.

Figure 7:
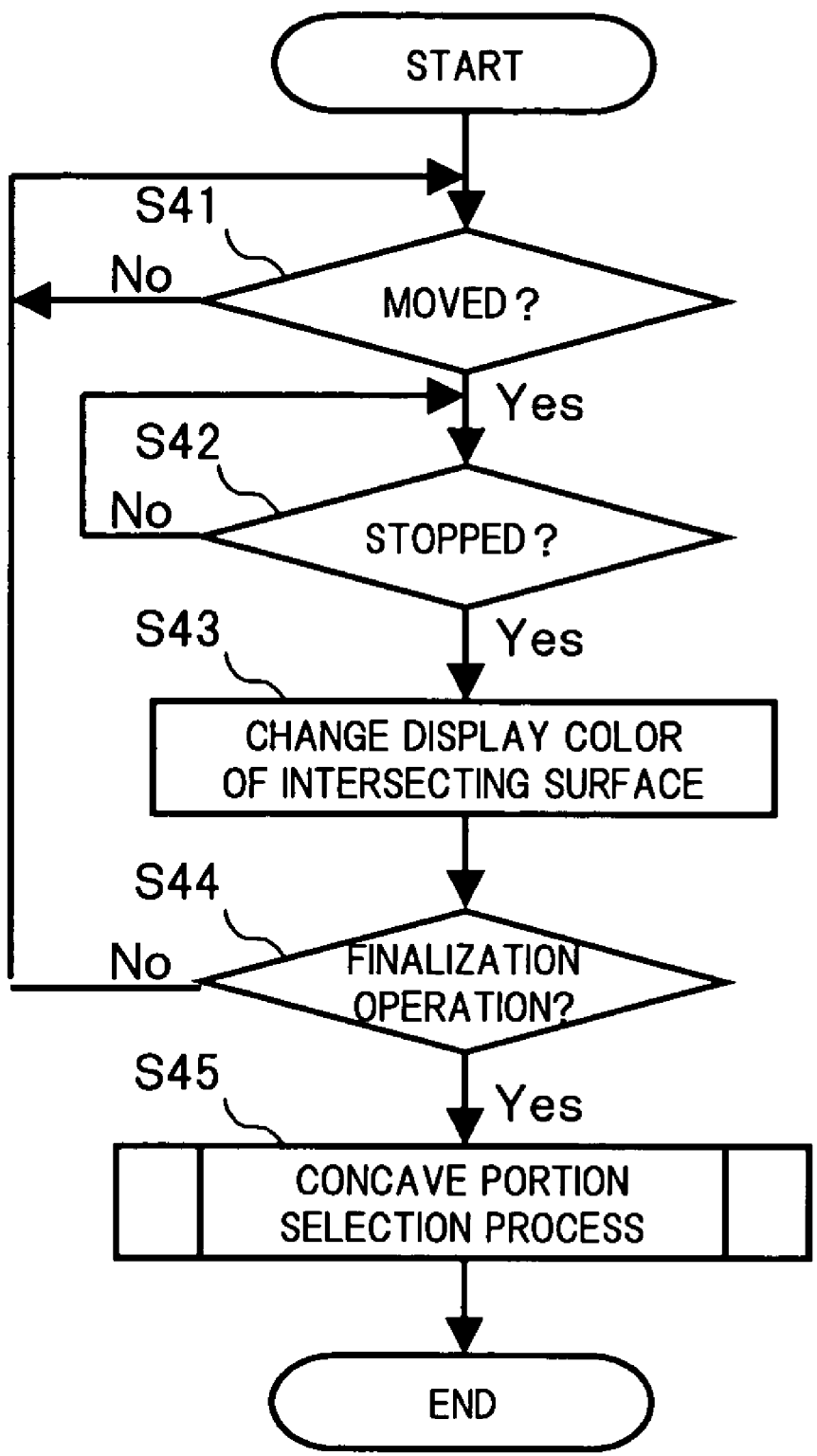
FIG. 7 is a flow chart showing a third embodiment of the execution timing of the concave portion selection process.

FIG. 7 shows a process for executing the concave portion selection process when the finalization operation is performed on the intersecting surface 30A that is shown explicitly while the water source model 32 is being moved.

In step 41, it is judged whether the water source model 32 has been moved or not. Then, if the water source model 32 has been moved (Yes), the process proceeds to step 42, while if the water source model 32 has not been moved (No), the process is in a waiting state.

In step 42, it is judged whether the water source model 32 is stopped or not. Then, if the water source model 32 is stopped (Yes), the process proceeds to step 43, where a display color of the intersecting surface 30A intersecting the vector 32A downward from the water source model 32 in the vertical direction is changed. On the other hand, if the water source model 32 is not stopped (No), since it can be considered that the water source model 32 is still being moved, the process waits till the water source model 32 is stopped.

In step 44, it is judged whether the finalization operation is performed or not. Namely, in this routine, since the display color of the intersecting surface 30A is merely changed even if the water source model 32 is moved, it is necessary to instruct explicitly to execute the concave portion selection process. Therefore, by judging whether the finalization operation is performed or not, it is judged whether the concave portion including the intersecting surface 30A the display color of which has just been changed may be selected or not. Then, if the finalization operation is performed (Yes), the process proceeds to step 45, where the concave portion selection process shown in FIG. 4 is performed. On the other hand, if no finalization operation is performed (No), the process returns to step 41.

According to the process described above, each time the water source model 32 is moved, the display color of the intersecting surface 30A of the model 30 located below the water source model 32 is changed. Thus, the presently attracted concave portion becomes obvious at a glance, and only when the finalization operation is performed at that position, the concave portion selection process is executed. Consequently, the concave portion selection process is performed only when it is really needed and, therefore, the computational load can be minimized.

Note, when the concave portion is selected from the model 30, it is desirable to make clear which portion is selected by changing its display color. Thus, information for judging whether the desired graphical element is selected or not can be provided to an operator of the three-dimensional CAD.

What is claimed is:

1. A computer-readable medium including a graphical element selection program for realizing on a computer the functions for:
    using a water source model with which an image of water flowing down from a water source can be conjured;
    defining a vector downward from said water source in a vertical direction;
    specifying one surface intersecting said vector among all surfaces constituting a model;
    selecting at least one surface constituting a concave portion including said intersecting surface; and
    displaying the water source model.

2. A graphical element selection program according to claim 1,
    wherein said water source model consist of a model of arbitrary shape to which added is an attribute for distinguishing said water source model from the model being an object of graphical element selection.

3. A graphical element selection program according to claim 2,
    wherein said water source model consists of a model of water tap shape.

4. A graphical element selection program according to claim 1,
    wherein said function for selecting at least one surface constituting the concave portion including said intersecting surface creates differential models by a difference set operation to subtract said model from the smallest cube enclosing said model, specifies a particular differential model that is matched geometrically and positionally with said intersecting surface from said differential models, and selects surfaces that are matched geometrically and positionally with the specified differential model by comparing all surfaces of the model with the specified differential model.

5. A graphical element selection program according to claim 1,
    wherein, when at least one surface constituting the concave portion including said intersecting surface is selected, a display color thereof is changed.

6. A graphical element selection program according to claim 1,
    wherein said functions are executed in real time with the movement of said water source model.

7. A graphical element selection program according to claim 1,
    wherein said functions are executed when said water source model is stopped after its movement.

8. A graphical element selection program according to claim 1,
    wherein said functions are executed when a finalization operation is performed on said intersecting surface that is shown explicitly while said water source model is being moved.

* * * * *

UNITED STATES PATENT AND TRADEMARK OFFICE
CERTIFICATE OF CORRECTION

| | |
|---|---|
| PATENT NO. | : 7,310,778 B2 |
| APPLICATION NO. | : 10/776259 |
| DATED | : December 18, 2007 |
| INVENTOR(S) | : Terutoshi Taguchi |

It is certified that error appears in the above-identified patent and that said Letters Patent is hereby corrected as shown below:

Column 7, Line 20, change "A graphical element selection program" to --The computer-readable medium--.

Column 7, Line 26, change "A graphical element selection program" to --The computer-readable medium--.

Column 7, Line 30, change "A graphical element selection program" to --The computer-readable medium--.

Column 8, Line 10, change "A graphical element selection program" to --The computer-readable medium--.

Column 8, Line 15, change "A graphical element selection program" to --The computer-readable medium--.

Column 8, Line 19, change "A graphical element selection program" to --The computer-readable medium--.

Column 8, Line 23, change "A graphical element selection program" to --The computer-readable medium--.

Signed and Sealed this

Tenth Day of June, 2008

JON W. DUDAS
*Director of the United States Patent and Trademark Office*